(12) United States Patent
Hwang

(10) Patent No.: US 11,134,576 B2
(45) Date of Patent: Sep. 28, 2021

(54) PRINTED CIRCUIT BOARD

(71) Applicant: SAMSUNG ELECTRO-MECHANICS CO., LTD., Suwon-si (KR)

(72) Inventor: Jun Oh Hwang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/674,309

(22) Filed: Nov. 5, 2019

(65) Prior Publication Data

US 2021/0051806 A1    Feb. 18, 2021

(30) Foreign Application Priority Data

Aug. 16, 2019    (KR) .................... 10-2019-0100498

(51) Int. Cl.
| | |
|---|---|
| H05K 1/00 | (2006.01) |
| H05K 1/02 | (2006.01) |
| H05K 1/03 | (2006.01) |
| H05K 1/09 | (2006.01) |
| H05K 1/11 | (2006.01) |
| H05K 1/14 | (2006.01) |
| H05K 1/16 | (2006.01) |
| H05K 1/18 | (2006.01) |
| H05K 3/00 | (2006.01) |
| H05K 3/22 | (2006.01) |
| H05K 3/32 | (2006.01) |

(Continued)

(52) U.S. Cl.
CPC .......... *H05K 3/4691* (2013.01); *H05K 1/183* (2013.01); *H05K 1/189* (2013.01); *H05K 3/4682* (2013.01)

(58) Field of Classification Search
CPC .. H05K 1/00; H05K 1/02; H05K 1/03; H05K 1/09; H05K 1/11; H05K 1/14; H05K 1/16; H05K 1/18; H05K 3/00; H05K 3/22; H05K 3/32; H05K 3/36; H05K 3/40; H05K 3/42; H05K 3/46
USPC ........ 361/749, 750, 751, 784, 792; 174/250, 174/252, 254, 255, 263; 29/829, 830, 29/837, 841, 846, 852
See application file for complete search history.

(56) References Cited

U.S. PATENT DOCUMENTS 4,677,528 A * 6/1987 Miniet ................ H01L 23/5387
235/488
5,072,074 A * 12/1991 DeMaso .............. H05K 3/4691
174/254

(Continued)

FOREIGN PATENT DOCUMENTS

| KR | 10-2012-0069452 A | 6/2012 |
|---|---|---|
| KR | 10-2016-0073766 A | 6/2016 |

*Primary Examiner* — Xiaoliang Chen
(74) *Attorney, Agent, or Firm* — Morgan, Lewis & Bockius LLP

(57) ABSTRACT

A printed circuit board has a first base region and a flexible region. The printed circuit board includes a core layer including a first insulating layer including a high elastic material and a first wiring layer disposed on the first insulating layer; a first build-up layer disposed on the core layer in the first base region, and including a second insulating layer including a low elastic material, and having a first through portion penetrating through the second insulating layer; and a first electronic component disposed in the first through portion and connected to the first wiring layer.

20 Claims, 13 Drawing Sheets

(51) Int. Cl.
*H05K 3/36* (2006.01)
*H05K 3/40* (2006.01)
*H05K 3/42* (2006.01)
*H05K 3/46* (2006.01)

(56) References Cited

U.S. PATENT DOCUMENTS

| | | | | |
|---|---|---|---|---|
| 5,263,248 A * | 11/1993 | Kiyota | ................ | H05K 3/4691 |
| | | | | 174/254 |
| 7,238,891 B2 * | 7/2007 | Muenzberg | .......... | H05K 3/4691 |
| | | | | 174/254 |
| 9,560,746 B1 * | 1/2017 | Bergman | ................ | H05K 1/189 |
| 10,353,146 B2 * | 7/2019 | Aleksov | ................ | H05K 1/0274 |
| 10,938,090 B2 * | 3/2021 | Jung | ........................ | H01Q 1/38 |
| 2008/0047737 A1 * | 2/2008 | Sahara | ................ | H05K 3/4691 |
| | | | | 174/254 |
| 2008/0251940 A1 * | 10/2008 | Lee | ........................ | H01L 24/86 |
| | | | | 257/777 |
| 2008/0285910 A1 * | 11/2008 | Yamada | ............... | H05K 3/4691 |
| | | | | 385/14 |
| 2011/0005811 A1 * | 1/2011 | Yamato | ................ | H05K 3/4691 |
| | | | | 174/254 |
| 2011/0019383 A1 * | 1/2011 | Aoyama | ............... | H05K 3/4694 |
| | | | | 361/792 |
| 2011/0135248 A1 * | 6/2011 | Langer | ................ | G02B 6/43 |
| | | | | 385/14 |
| 2012/0147571 A1 * | 6/2012 | Just | ........................ | H05K 1/147 |
| | | | | 361/750 |
| 2013/0014982 A1 * | 1/2013 | Segawa | ................ | H05K 1/141 |
| | | | | 174/263 |
| 2013/0341075 A1 * | 12/2013 | Becker | ................ | H05K 3/0064 |
| | | | | 174/255 |
| 2014/0037243 A1 * | 2/2014 | Lee | ........................ | G02B 6/43 |
| | | | | 385/14 |
| 2014/0131889 A1 * | 5/2014 | Kim | ....................... | H01L 23/552 |
| | | | | 257/774 |
| 2014/0202743 A1 * | 7/2014 | Kim | ..................... | H05K 3/4691 |
| | | | | 174/254 |
| 2014/0239276 A1 * | 8/2014 | Lin | ..................... | H01L 51/5246 |
| | | | | 257/40 |
| 2014/0268594 A1 * | 9/2014 | Wang | .................... | H05K 1/189 |
| | | | | 361/749 |
| 2014/0268780 A1 * | 9/2014 | Wang | ........................ | F21S 4/22 |
| | | | | 362/249.06 |
| 2015/0211718 A1 * | 7/2015 | Diekmann | ............. | H05K 1/115 |
| | | | | 362/382 |
| 2016/0066429 A1 * | 3/2016 | Taniguchi | ............ | H05K 1/0278 |
| | | | | 361/749 |
| 2016/0178956 A1 * | 6/2016 | Kim | .................. | G02F 1/133308 |
| | | | | 349/58 |
| 2016/0183363 A1 * | 6/2016 | Lee | ...................... | B23K 26/362 |
| | | | | 174/254 |
| 2016/0295176 A1 * | 10/2016 | Jeong | ................... | G06F 1/1637 |
| 2016/0350572 A1 * | 12/2016 | Kim | ...................... | G06F 3/03547 |
| 2017/0020002 A1 * | 1/2017 | Wang | ................ | H01L 23/49827 |
| 2017/0243854 A1 * | 8/2017 | Sugiyama | .......... | H01L 21/4853 |
| 2017/0374732 A1 * | 12/2017 | Denda | .................... | H05K 1/115 |
| 2018/0006520 A1 * | 1/2018 | Ishimoto | ................ | H02K 11/30 |
| 2018/0122776 A1 * | 5/2018 | Suyama | ................ | H01L 23/12 |
| 2018/0159075 A1 * | 6/2018 | Kim | ........................ | H01L 51/56 |
| 2019/0081380 A1 * | 3/2019 | Bates | ................ | H01L 25/0655 |
| 2020/0045826 A1 * | 2/2020 | Wang | .................... | G06F 1/1658 |

* cited by examiner

PRINTED CIRCUIT BOARD

CROSS-REFERENCE TO RELATED APPLICATION(S)

This application claims benefit of priority to Korean Patent Application No. 10-2019-0100498 filed on Aug. 16, 2019 in the Korean Intellectual Property Office, the disclosure of which is incorporated herein by reference in its entirety.

TECHNICAL FIELD

The present disclosure relates to a printed circuit board. More specifically, the present disclosure relates to a printed circuit board including a flexible region.

BACKGROUND

Recently, as miniaturization and thinning of portable electronic devices such as mobile phones and tablet PCs is required, electronic devices which are foldable have emerged. With this trend, a printed circuit board included in the electronic device is also required to have foldable characteristics. Meanwhile, the printed circuit board is required to be miniaturized and thinned in terms of shapes, and high reliability and electric signal path shortening are required in terms of functionality.

SUMMARY

An aspect of the present disclosure is to provide a printed circuit board which is foldable, and has a reduced thickness and a short signal path.

According to an aspect of the present disclosure, a printed circuit board has a first base region and a flexible region. The printed circuit board includes a core layer including a first insulating layer including a high elastic material and a first wiring layer disposed on the first insulating layer; a first build-up layer disposed on the core layer in the first base region, and including a second insulating layer including a low elastic material, and having a first through portion penetrating through the second insulating layer; and a first electronic component disposed in the first through portion and connected to the first wiring layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Electronic Device

Figure 1:
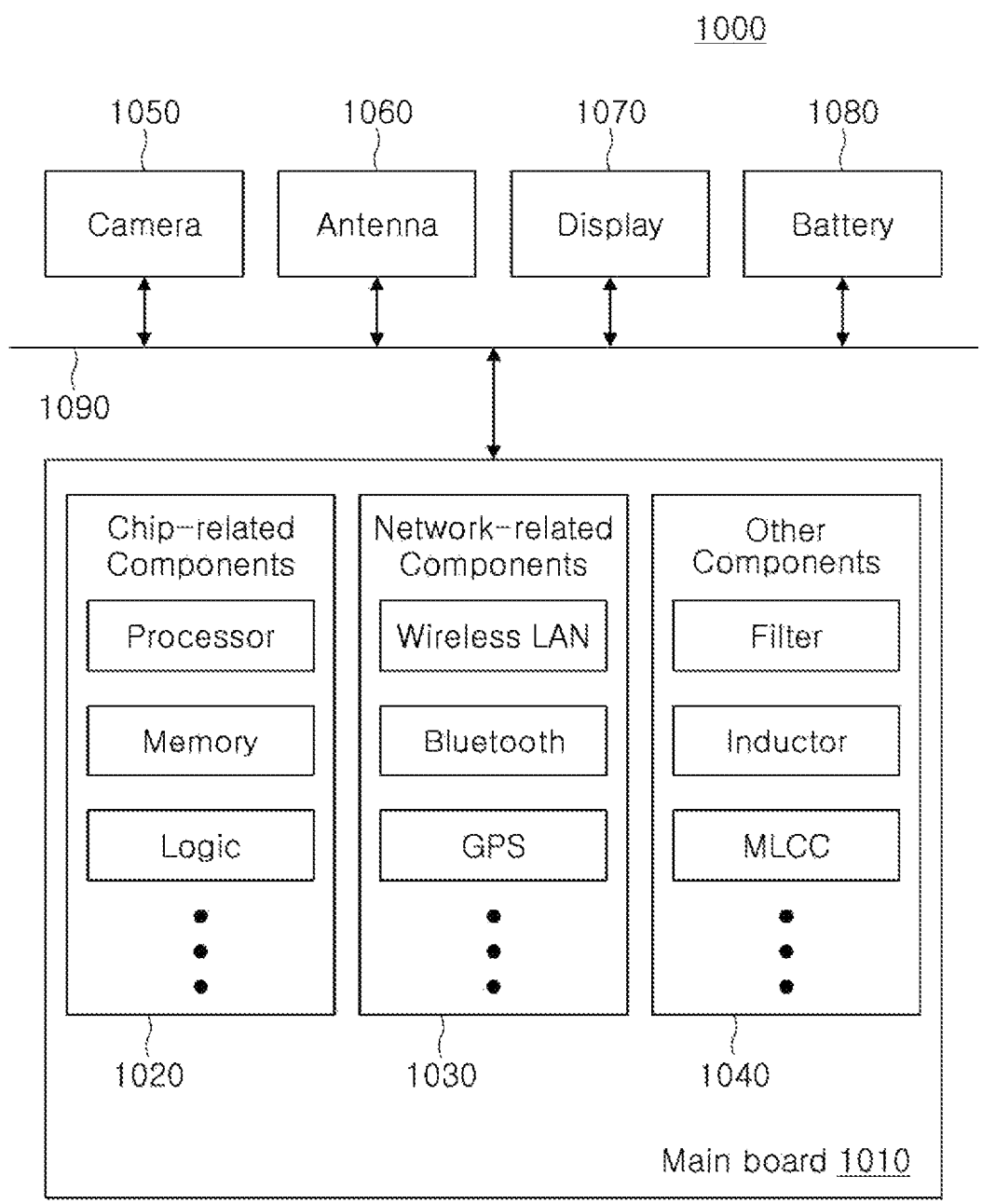
FIG. 1 is a schematic view illustrating an example of a block diagram of an electronic device system according to an example.

FIG. 1 is a schematic view illustrating an example of a block diagram of an electronic device system according to an example.

Referring to FIG. 1, an electronic device 1000 may include a motherboard 1010 (e.g., a main board). The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
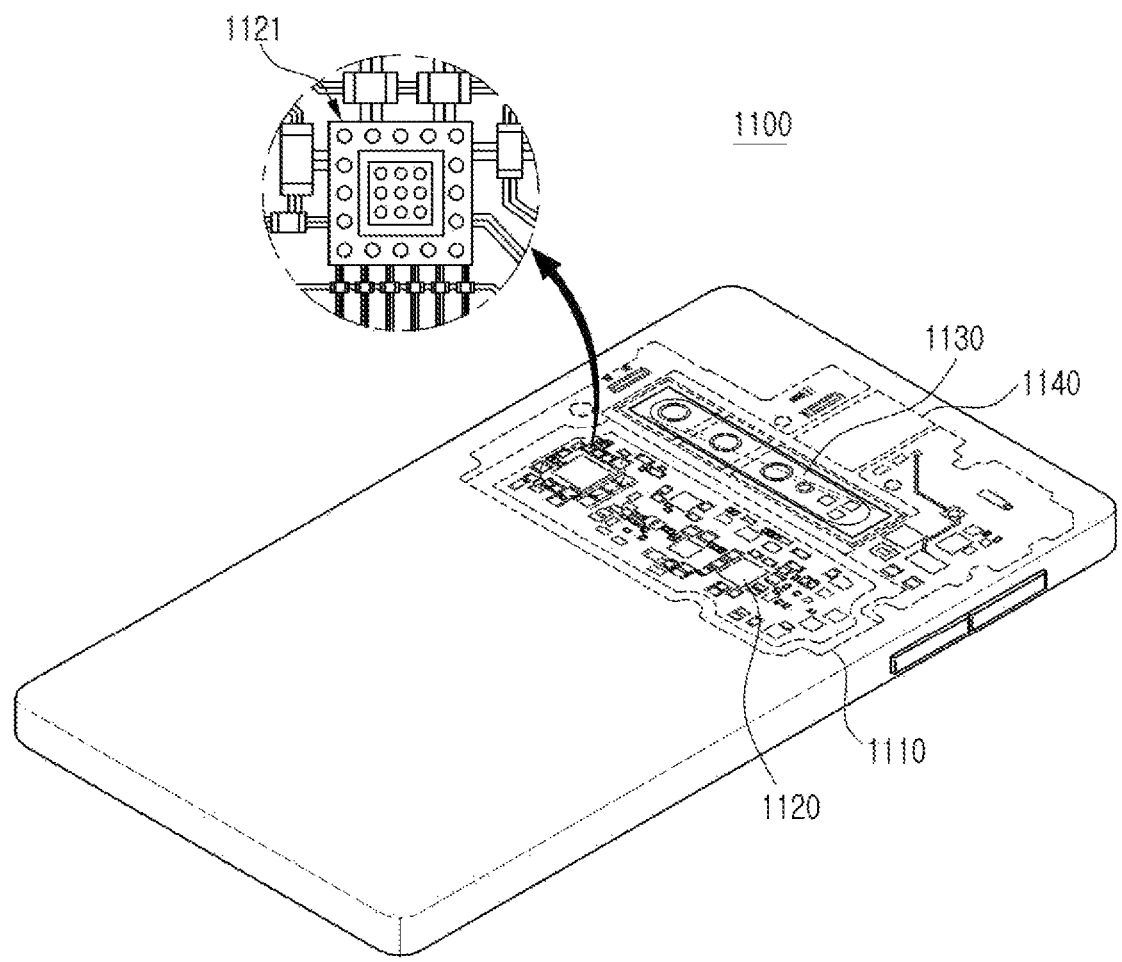
FIG. 2 is a schematic perspective view of a block diagram of an electronic device according to an example.

FIG. 2 is a schematic perspective view of a block diagram of an electronic device according to an example.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the main board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Printed Circuit Board

Figure 3:
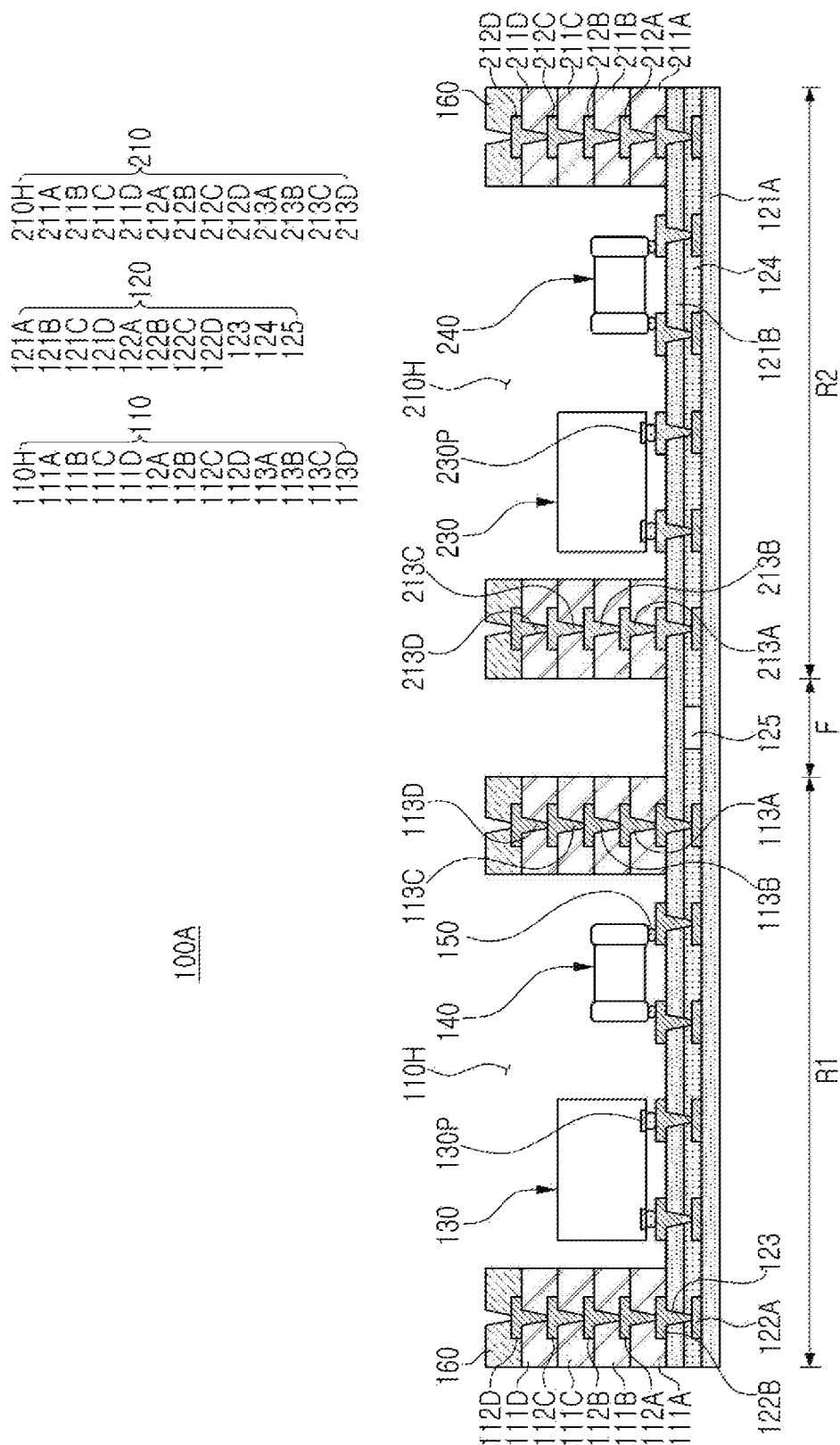
FIG. 3 is a schematic cross-sectional view of a printed circuit board according to an example.

FIG. 3 is a schematic cross-sectional view of a printed circuit board 100A according to an example.

Referring to FIG. 3, a printed circuit board 100A according to an example has a flexible region F, a first base region R1, and a second base region R2. In addition, the printed circuit board 100A includes a first build-up layer 110 disposed on a core layer 120 in the first base region R1, and having a first through portion 110H, a second build-up layer 210 disposed on the core layer 120 in the second base region R2, and having a second through portion 210H, first electronic components 130 and 140 disposed in the first through portion 110H, second electronic components 230 and 240 disposed in the second through portion 210H, a connection terminal 150 disposed on the first electronic components 130 and 140 and the second electronic components 230 and 240, and a passivation layer 160 disposed on the first build-up layer 110 and the second build-up layer 210.

Meanwhile, in order to form a printed circuit board including a flexible region to have a foldable property, a case in which a substrate in which a build-up layer is formed on both surfaces of a core layer is implemented may be considered. In addition, a case in which an electronic component is mounted on a build-up layer by a surface mounting type (SMT) may be considered. However, in this case, the thickness of the printed circuit board on which the electronic component is mounted is limited due to the thickness of the build-up layer formed on both surfaces of the core layer and the electronic component itself. In addition, since a signal path length from the electronic component to a wiring layer formed in the core layer is long, there is a limitation in transmitting high-capacity and/or high-speed signals such as 5G.

On the other hand, as in the printed circuit board according to an example, when a build-up layer is only formed on one surface of the core layer, since the build-up layer is not formed on the other surface of the core layer, the printed circuit board may be thinned. In addition, instead of mounting the electronic component on the build-up layer by a surface mounting type (SMT) method, a through portion is formed and the electronic component is disposed in the through portion, such that the thickness of the printed circuit board on which the electronic component is mounted can be maintained regardless of the thickness of the electronic component itself. In addition, since the electronic component may be directly mounted on a wiring layer of the core layer, an electrical signal path may be significantly reduced, which is advantageous in transmitting high-capacity and/or high-speed signals such as 5G.

Hereinafter, each configuration of the printed circuit board 100A according to an example will be described in more detail.

The printed circuit board 100A may include a flexible region F, a first base region R1, and a second base region R2. The flexible region F has a property of having relatively greater bendability and/or flexibility than the first base region R1 and the second base region R2. Therefore, the flexible region F may be bent relatively better than the first base region R1 and the second base region R2. That is, the flexible region F, the first base region R1, and the second base region R2 are distinguishable, based on relative bendability and/or flexibility. The flexible region F may be disposed at a central portion of the printed circuit board 100A, and the first base region R1 and the second base region R2 may be disposed at both side portions of the flexible region F. That is, the flexible region F may be disposed between the first base region R1 and the second base region R2. Accordingly, the printed circuit board 100A may be bent of folded based on the flexible region F. In this case, the first base region R1 and the second base region R2 may be disposed to face each other.

The first build-up layer 110 includes a first insulating layer 111A, a first wiring layer 112A disposed on the first insulating layer 111A, a second insulating layer 111B disposed on the first insulating layer 111A, and covering at least a portion of the first wiring layer 112A, a third insulating layer 111C disposed on the second insulating layer 111B, and covering at least a portion of the second wiring layer 112B, a third wiring layer 112C disposed on the third insulating layer 111C, a fourth insulating layer 111D disposed on the third insulating layer 111C, and covering at least a portion of the third wiring layer 112C, a fourth wiring layer 112D disposed on the fourth insulating layer 111D, a first via 113A penetrating through the first insulating layer 111A and electrically connecting the first wiring layer 112A and the second wiring layer 122B included in a core layer 120, a second via 113B penetrating through the second insulating layer 111B and connecting the first wiring layer 112A and the second wiring layer 112B, a third via 113C penetrating through the third insulating layer 111C and connecting the second wiring layer 112B and the third wiring layer 112C, and a fourth via 113D penetrating through the fourth insulating layer 111D and connecting the third wiring layer 112C and the fourth wiring layer 112D.

However, the present disclosure is not limited thereto, and may be changed by those skilled in the related art. That is, the number of insulating layers, wiring layers, and vias included in the first build-up layer 110 may be more or less than that illustrated in the drawings.

The second build-up layer 210 includes a first insulating layer 211A, a first wiring layer 212A disposed on the first insulating layer 211A, a second insulating layer 211B disposed on the first insulating layer 211A, and covering at least a portion of the first wiring layer 212A, a second wiring layer 212B disposed on the second insulating layer 211B, a third insulating layer 211C disposed on the second insulating layer 211B, and covering at least a portion of the second wiring layer 212B, a third wiring layer 212C disposed on the third insulating layer 211C, a fourth insulating layer 211D disposed on the third insulating layer 211C, and covering at least a portion of the third wiring layer 212C, a fourth wiring layer 212D disposed on the fourth insulating layer 211D, a first via 213A penetrating through the first insulating layer 211A, and electrically connecting the first wiring layer 212A and the second wiring layer 122B included in the core layer 120, a second via 213B penetrating through the second insulating layer 211B, and connecting the first wiring layer 212A and the second wiring layer 212B, a third via 213C penetrating through the third insulating layer 211C, and connecting the second wiring layer 212B and the third wiring layer 212C, and a fourth via 213D penetrating through the fourth insulating layer 211D, and connecting the third wiring layer 212C and the fourth wiring layer 212D.

However, the present disclosure is not limited thereto, and may be changed by those skilled in the art. That is, the number of insulating layers, wiring layers, and vias included in the second build-up layer 210 may be more or less than that shown in the drawings.

A first through portion 110H and a second through portion 210H may be formed to vertically penetrate from one side to the other side of the first build-up layer 110 and the second build-up layer 210, respectively. Therefore, the first through portion 110H and the second through portion 210H may expose at least a portion of the core layer 120. For example, at least a portion of the second insulating layer 121B and the second wiring layer 122B, which are upper configurations of the core layer 120 may be exposed. Therefore, first electronic components 130 and 140 and second electronic components 230 and 240 may be directly mounted on the core layer 120.

A material of the first to fourth insulating layers 111A, 111B, 111C, 111D, 211A, 211B, 211C, and 211D is not particularly limited, and any material may be used as long as the material has insulating properties. For example, a thermosetting resin such as an epoxy resin, a thermoplastic resin such as a polyimide, or a resin in which these resins are impregnated with a core such as glass cloth or glass fabric, together with an inorganic filler, for example, a prepreg (prepreg), Ajinomoto Build-up Film (ABF), FR-4, Bismaleimide Triazine (BT), and the like, can be used. If necessary, a Photo Imagable Dielectric (PID) resin may be used. In addition, the material of the first to fourth insulating layers 111A, 111B, 111C, 111D, 211A, 211B, 211C, and 211D may include a low elastic material having a lower limit of reversible elasticity than the material of the first insulating layer 121A and the second insulating layer 121B included in the core layer 120. That is, an expression of the material of the first to the fourth insulating layers 111A, 111B, 111C, 111D, 211A, 211B, 211C, and 211D included in the first build-up layer 110 and the second build-up layer 210 has a relatively low limitation of reversible elasticity than the reversible elasticity of the first insulating layer 121A and the second insulating layer 121B included in the core layer 120.

The first to fourth wiring layers 112A, 112B, 112C, 112D, 212A, 212B, 212C, and 212D may be electrically connected to the first wiring layer 122A and the second wiring layer 122B of the core layer 120 as necessary. In addition, the first electronic components 130 and 140 and the second electronic components 230 and 240 may be electrically connected as necessary. As a formation material of the first to fourth wiring layers 112A, 112B, 112C, 112D, 212A, 212B, 212C, and 212D, a conductive material such as copper (Cu), aluminum (Al), silver (Ag), tin (Sn), gold (Au), nickel (Ni), lead (Pb), titanium (Ti), or alloys thereof may be used. The first to fourth wiring layers 112A, 112B, 112C, 112D, 212A, 212B, 212C, and 212D may perform various functions depending on designs. For example, the wiring layers may include ground (GND) patterns layers, power (PWR) patterns, signal (S) patterns, and the like. Here, the signal(S) patterns may include various signals except for the ground (GND) signals, the power (PWR) signals, and the like, such as data signals, and the like. In addition, via pads, connection terminal pads, and the like are included.

As a formation material of each of the first to fourth vias 113A, 113B, 113C, 113D, 213A, 213B, 213C, and 213D, a conductive material such as copper (Cu), aluminum (Al), silver (Ag), tin (Sn), and gold (Au), nickel (Ni), lead (Pb), titanium (Ti), or alloys thereof may be used. As a formation material of each of the first to fourth vias 113A, 113B, 113C, 113D, 213A, 213B, 213C, and 213D, a conductive material such as copper (Cu), aluminum (Al), silver (Ag), tin (Sn), and gold (Au), nickel (Ni), lead (Pb), titanium (Ti), or alloys thereof may be used. In addition, each shape of each of the first to fourth vias 113A, 113B, 113C, 113D, 213A, 213B, 213C, and 213D may be applied to all shapes known in the art, such as a tapered shape and a cylindrical shape.

The core layer 120 includes a first insulating layer 121A, a first wiring layer 122A disposed on the first insulating layer 121A, an adhesive layer 124 disposed on the first insulating layer 121A, and covering at least a portion of the first wiring layer 122A, an opening 125 formed in the adhesive layer 124, a second insulating layer 121B disposed on the adhesive layer 124 and the opening 125, a second wiring layer 122B disposed on the second insulating layer 121B, and a via 123 penetrating through the adhesive layer 124 and the second insulating layer 122B, and electrically connecting the first wiring layer 122A and the second wiring layer 122B.

However, the configuration of the core layer 120 is not limited thereto, and the core layer 120 may be changed by those skilled in the art. That is, the number of insulating layers, wiring layers, adhesive layers, openings, and vias included in the core layer 120 may be more or less than that shown in the drawings.

Although a material of the first insulating layer 121A and the second insulating layer 121B is not particularly limited, an insulating material having flexible properties that can withstand deformation processes such as repeated curving, bending, and folding, and the like, may be used. For example, polyethylene terephthalate (PET), polyethylene naphthalate (PEN), polycarbonate (PC), polyethersulphone (PES), polyarylate (PAR), polycylic olefin (PCO), polyimide (PI), and the like can be used. The first insulating layer 121A and the second insulting layer 121B may include the same material, or may include different materials. In addition, the first insulating layer 121A and the second insulating layer 121B may include a high elastic material having a greater limitation of reversible elasticity than the material of the first to fourth insulating layers 111A, 111B, 111C, 111D, 211A, 211B, 211C, and 211D included in the first build-up layer 110 and the second build-up layer 210. That is, an expression of a high elastic material indicates that the material of the first insulating layer 121A and the second insulating layer 121B included in the core layer 120 has a relatively greater limitation than the reversible elasticity of the material of the first to fourth insulating layers 111A, 111B, 111C, 111D, 211A, 211B, 211C, and 211D included in the first build-up layer 110 and the second build-up layer 210. For example, the high elastic material may have a modulus of elasticity greater than that of the low elastic material.

The first wiring layer 122A and the second wiring layer 122B may be electrically connected to the first electronic components 130 and 140 and the second electronic components 230 and 240 as necessary. In addition, as necessary, the first wiring layer 122A and the second wiring layer 122B may be also electrically connected the first to fourth insulating layers 112A, 112B, 112C, and 112D of the first build-up layer 110 and the first to fourth insulating layers 212A, 212B, 212C, and 212D of the second build-up layer 210.

As a formation material of the first wiring layer 122A and the second wiring layer 122B, a conductive material such as copper (Cu), aluminum (Al), silver (Ag), tin (Sn), gold (Au), nickel (Ni), lead (Pb), titanium (Ti), alloys thereof may be used. The first wiring layer 122A and the second wiring layer 122B may perform various functions depending on designs. For example, the first wiring layer 122A and the second wiring layer 122B may include ground (GND) pattern layers, power (PWR) patterns, signal (S) patterns, and the like. Here, the signal (S) patterns may include various signals except for the ground (GND) signals, the power (PWR) signals, and the like, such as data signals, and the like. In addition, via pads, connection terminal pads, and the like are included.

A via 123 may electrically connect the first wiring layer 122A and the second wiring layer 122B to each other. As a formation material of the via 123, a conductive material such as copper (Cu), aluminum (Al), silver (Ag), tin (Sn), gold (Au), nickel (Ni), lead (Pb), titanium (Ti), or alloys thereof, may be used. The via 123 may be completely filled with a conductive material, or the conductively material may be formed along a wall of the vias. In addition, the via 123 may have all shapes known in the related art, such as a tapered shape, a cylindrical shape, and the like.

An adhesive layer 124 is interposed between the first insulating layer 121A and the second insulating layer 121B to serve to bond the first insulating layer 121A and the second insulating layer 121B to each other. A material of the adhesive layer 124 is not particularly limited, and any material can be used, as long as the material has adhesiveness. For example, a commercial bonding sheet may be used.

An opening 125 may be formed in a portion of the adhesive layer 124 of the flexible region R. Therefore, at least a portion of one surface of the first insulating layer 121A and the second insulating layer 121B, in contact with the adhesive layer 124, may be opened and exposed through the opening 125. As such, by forming the opening 125 in the adhesive layer 124, flexibility of the flexible region R of the printed circuit board 100A may be further improved. Meanwhile, the opening 125 may not be filled with other materials. In this case, the opening 125 may include a void, or may contain a gas or air. Alternatively, the opening 125 may be filed with an elastomer that is a flexible material. For example, a styrene type, a PVC type, an olefin type, a polyester type, a polyamide type, a urethane type-elastomer, or the like can be used. In one example, a region of second insulating layer 121B covering the opening 125 may be exposed from the first build-up layer 110 and the second build-up layer 210. That is, the first build-up layer 110 and the second build-up layer 210 may not be disposed on the flexible region F, in which the region of the second insulating layer 121B covers the opening 125.

The first electronic components 130 and 140 and the second electronic components 230 and 240 may be disposed in the first through portion 110H and the second through portion 210H, and may be mounted on the core layer 120 through a connection terminal 150. More specifically, it may be connected to the second wiring layer 122B included in the core layer 120 through the connection terminal 150. The first electronic components 130 and the second electronic components 230 and 240 may be a plurality of electronic components, respectively, and may have a structure in which the plurality of electronic components are spaced apart from each other in the first through portion 110H or the second through portion 210H. The first electronic components 130 and 140 and the second electronic components 230 and 240 may be passive components such as a multilayer ceramic capacitor (MLCC), a power inductor (PI), or the like, and may be an integrated circuit (IC) die. When the first electronic component 130 and the second electronic component 230 are an integrated circuit (IC) die, the first electronic component 130 and the second electronic component 230 may include an electrode pads 130P and 230P, and the electrode pads 130P and 230P may be connected to the connection terminal 150.

The connection terminal 150 is configured to physically and/or electrically connect the first electronic components 130 and 140 and the second electronic components 230 and 240 to the wiring layers 122A and 122B of the core layer 120. The connection terminal 150 may be formed of a conductive material, for example, solder, but is not limited thereto. The connection terminal 150 may be a land, a ball, a pin, or the like. The connection terminal 150 may be formed of a multiple layer or a single layer.

The passivation layer 160 is an additional configuration for protecting the first build-up layer 110 and the second build-up layer 120 from external physical and chemical damages. The passivation layer 160 may expose portions of each of the redistribution layer 112D of the first build-up layer 110 and the redistribution layer 212D of the second build-up layer 210. A material of the passivation layer 160 is not particularly limited. For example, a photosensitive insulating material such as a photosensitive insulating resin or a solder resist may be used, but is not limited thereto.

Figure 4:
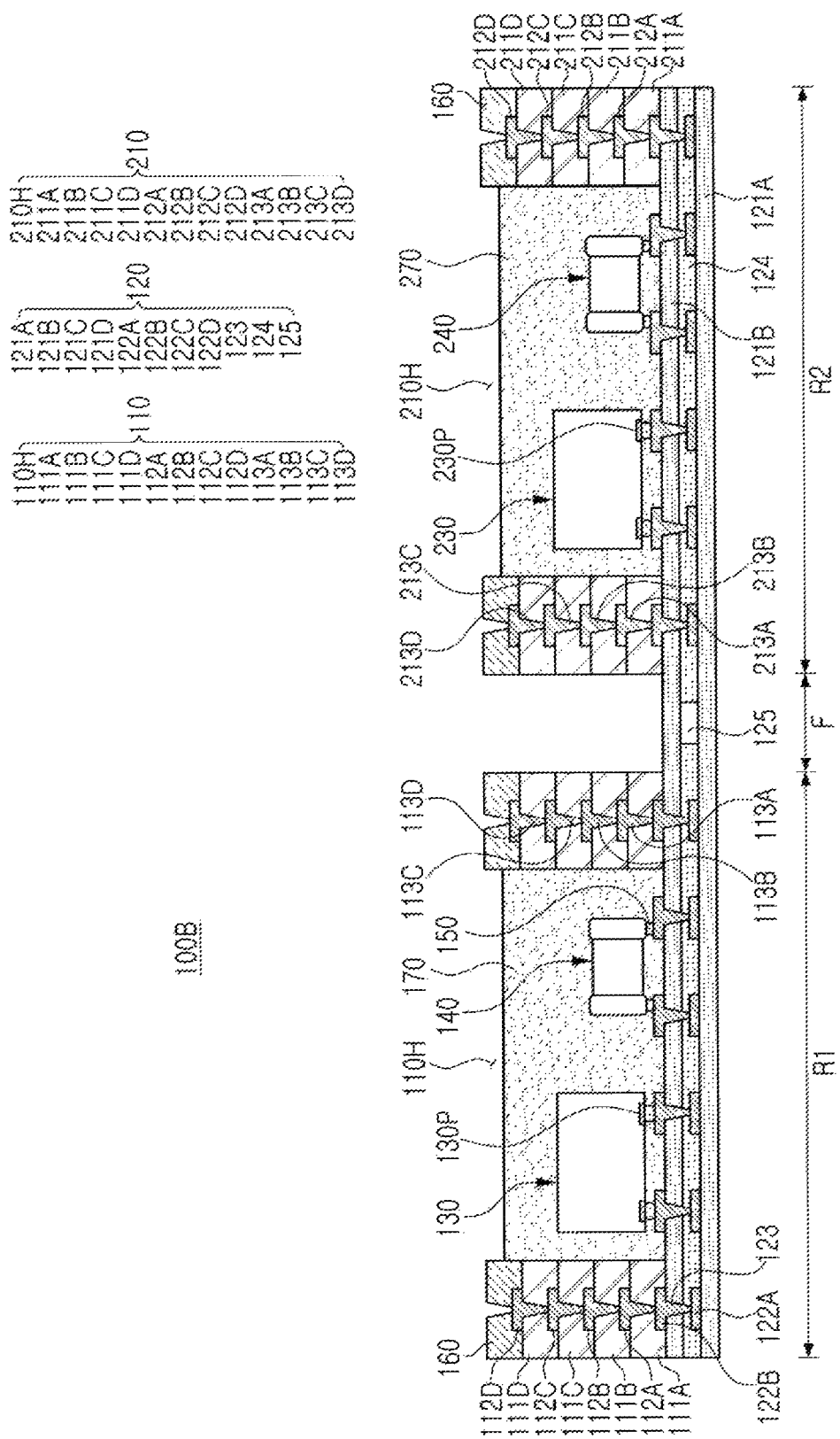
FIG. 4 is a schematic cross-sectional view of a printed circuit board according to another example.

FIG. 4 is a schematic cross-sectional view of a printed circuit board 100B according to another example.

Referring to FIG. 4, as compared to the printed circuit board 110A according to the above-described example, the printed circuit board 100B according to another example further includes a first encapsulant 170 covering at least portions of each of the first electronic components 130 and 140 and the first build-up layer 110 and filling at least a portion of the first through portion 110H, and a second encapsulant 270 covering at least portions of each of the second electronic components 230 and 240 and the second build-up layer 210 and filling at least a portion of the second through portion 210H.

That is, the printed circuit board 100B and the first electronic components 130 and 140 and second electronic components 230 and 240 mounted on the printed circuit board 100B may be encapsulated with the first encapsulant 170 and the second encapsulant 270 to realize a package.

The first encapsulant 170 and the second encapsulant 270 include an insulating material, specifically a non-photosensitive insulating material, more specifically, a non-photosensitive insulating material including an inorganic filler and an insulating resin, for example, a thermosetting resin such as an epoxy resin, a thermoplastic resin such as a polyimd, or a resin in which a reinforcing material such as an inorganic filler is contained in the thermosetting resin or the thermoplastic resin, in detail, a non-photosensitive insulating material such as an Ajinomoto build-up film (ABF), an epoxy molding compound (EMC), or the like, may be used. As necessary, a material in which an insulating resin such as a thermosetting resin or a thermoplastic resin is impregnated in an inorganic filler together with a core material such as a glass fiber, may be used. Thereby, it is possible to improve void and undulation problems, a warpage control may be easier. If necessary, Photoimageable Encapsulant (PID) may be used.

Other contents are substantially the same as described in the printed circuit board 100A according to an example, detailed description thereof will be omitted.

Figure 5:
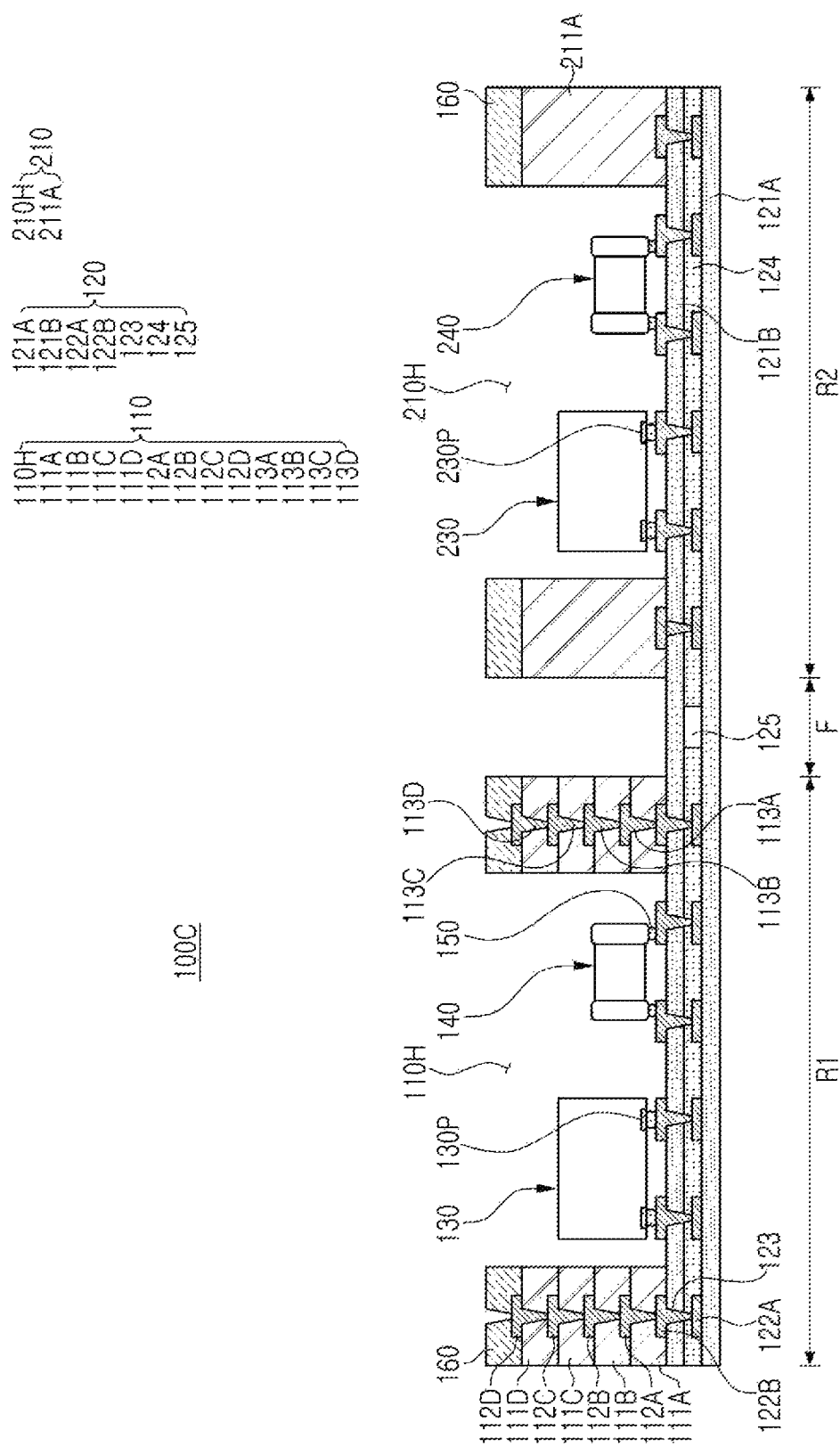
FIG. 5 is a schematic cross-sectional view of a printed circuit board according to another example.

FIG. 5 is a schematic cross-sectional view of a printed circuit board 100C according to another example.

Referring to FIG. 5, as compared to the printed circuit board 110A according to the above-described example, in a printed circuit board 100C according to another example, the second build-up layer 210 does not include a wiring layer. That is, when the number of wiring layers required for electrical connection of the second electronic components 230 and 240 is low, wiring layers of the core layer 110 may be utilized, and the wiring layers may not be formed in the second build-up layer 210. However, this is merely an example for showing that the number of wiring layers included in the first build-up layer 110 and the second build-up layer 210 may be different, but the present disclosure is not limited thereto. As a non-limiting example, as shown in the drawings, when the first build-up layer 110 includes the first to fourth wiring layers 112A, 112B, 112C, and 112D, the second build-up layer 210 may include one or more to three or less wiring layers of the first to fourth wiring layers 212A, 212B, 212C, and 212D.

Other contents are substantially the same as described in the printed circuit board 100A according to an example, detailed description thereof will be omitted.

Figure 6:
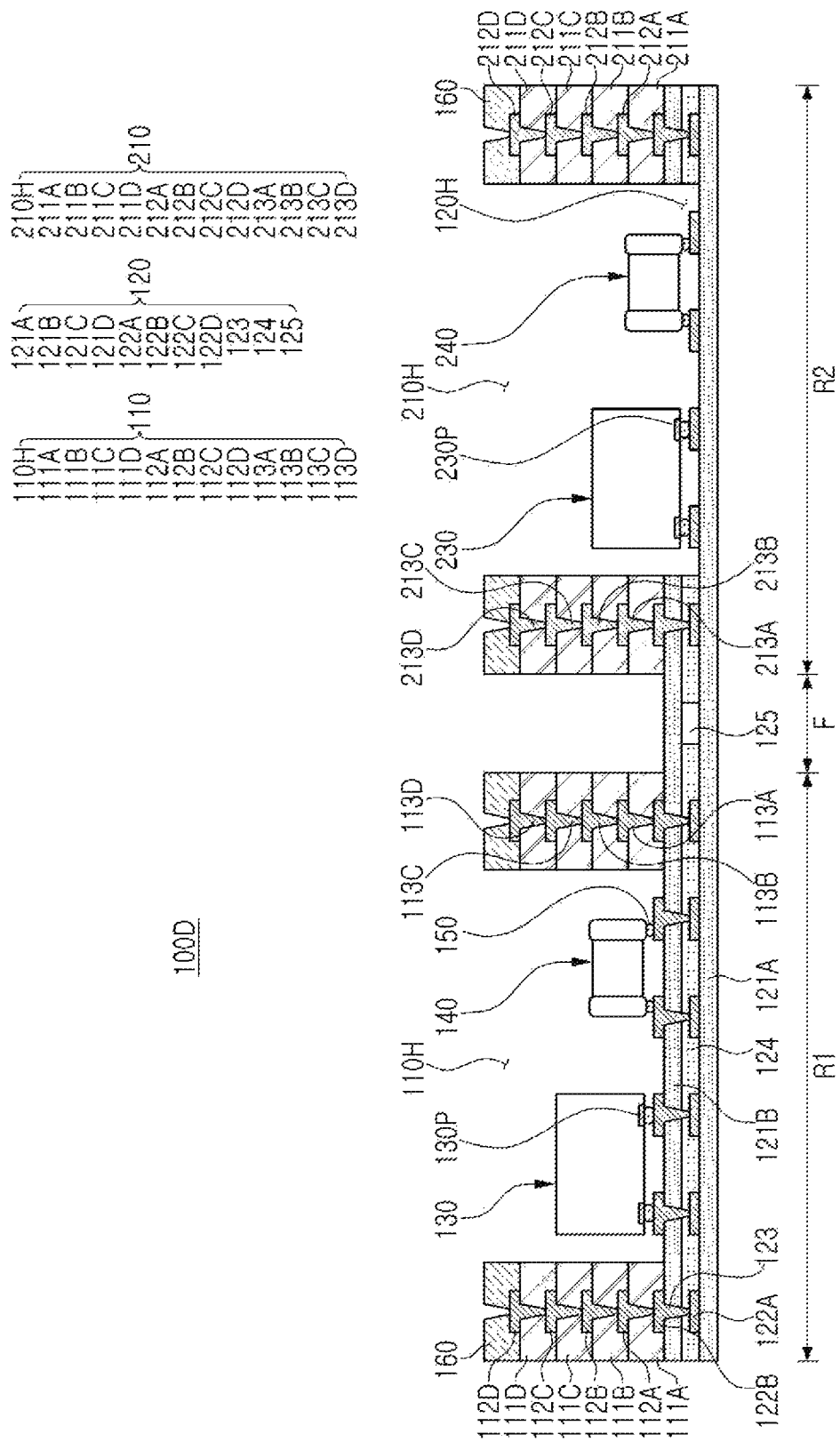
FIG. 6 is a schematic cross-sectional view of a printed circuit board according to another example.

FIG. 6 is a schematic cross-sectional view of a printed circuit board 100D according to another example.

Referring to FIG. 6, a printed circuit board 100D according to another example further includes a third through portion 120H penetrating through a portion of the core layer 120 in the printed circuit board 110A according to the above-described example. The third through portion 120H may extend from the second through portion 210H, and may penetrate through the second insulating layer 121B and the adhesive layer 124. In this case, the second insulating layer 121B and the adhesive layer 124 may each have an opening by the third through portion 120H. Therefore, the first insulating layer 121A and the first wiring layer 122A of the core layer 120 may be exposed through the second through portion 210H and the third through portion 120H, and the second electronic components 230 and 240 may be disposed on the first insulating layer 121A and the first wiring layer 122A of the core layer 120. In this case, a distance from the second electronic components 230 and 240H to a lower surface of the first insulating layer 121A may be less than a distance from the first electronic components 130 and 140 to the lower surface of the first insulating layer 121A.

As described above, when the third through portion 120H extends from the second through portion 210H, since the depth of the through portion becomes deeper, the thickness of the printed circuit board 100D may be maintained after mounting the second electronic components 230 and 240 even when the thicknesses of the second electronic components 230 and 240 are thick. In addition, since the electronic component may be directly mounted on the first wiring layer 122A of the core layer 120, electrical signal paths of the second electronic components 230 and 240 may be significantly reduced. Therefore, it may have more advantageous performance when transmitting a high-capacity and/or high-speed signals such as 5G.

Other content is substantially the same as described in the printed circuit board 100A according to an example, and a detailed description thereof will be omitted.

Figure 7:
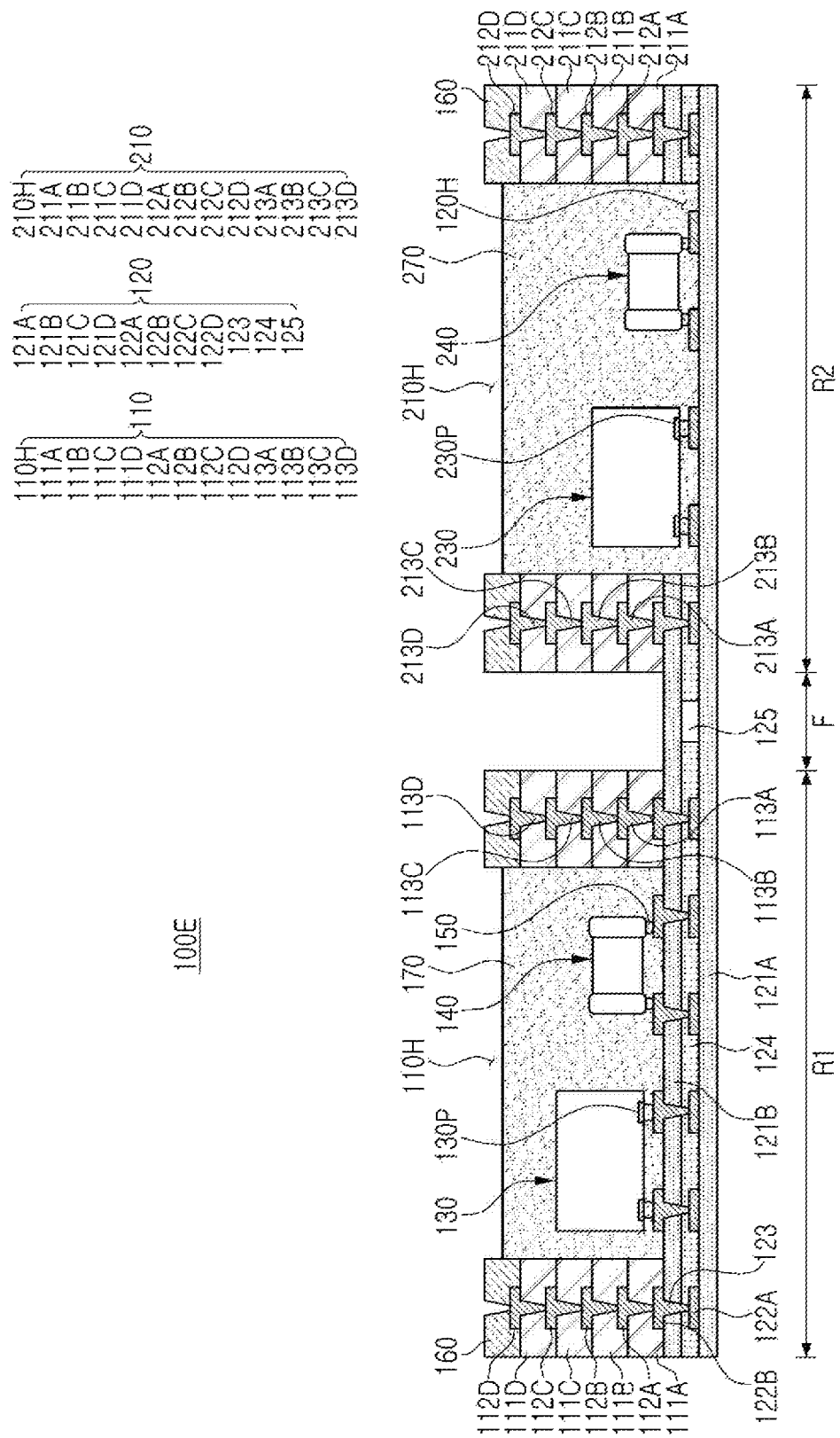
FIG. 7 is a schematic cross-sectional view of a printed circuit board according to another example.

FIG. 7 is a schematic cross-sectional view of a printed circuit board 100E according to another example.

Referring to FIG. 7, as compared to the printed circuit board 110D according to the above-described example, the printed circuit board 100E according to example further includes a first encapsulant 170 covering at least portions of each of the first electronic components 130 and 140 and the first build-up layer 110, and filling at least a portion of the first through portion 110H, and a second encapsulant 270 covering at least portions of each of the second electronic components 230 and 240 and the second build-up layer 210, and filling at least portions of each of the second through portion 210H and the third through portion 120H.

That is, a printed circuit board 100E and the first electronic components 130 and 140 and the second electronic components 230 and 240 mounted on the printed circuit board 100E may be encapsulated with the first encapsulant 170 and the second encapsulant 270 to realize a package.

The first encapsulant 170 and the second encapsulant 270 may include an insulating material, specifically, a non-photosensitive insulating material, more specifically, a non-photosensitive insulating material including an inorganic filler and an insulating resin, for example, a thermosetting resin such as an epoxy resin, a thermoplastic resin such as a polyimide, or a resin in which a reinforcing material such as an inorganic filler is contained in the thermosetting resin or the thermoplastic resin, in detail, a non-photosensitive insulating material such as an Ajinomoto build-up film (ABF), an epoxy molding compound (EMC), or the like, may be used. As needed, a material in which an insulating resin such as the thermosetting resin or the thermoplastic resin is impregnated in an inorganic filler together with a core material such as a glass fiber, may be used. Thereby, it is possible to improve void and undulation problems, and a warpage control may be easier. If necessary, a photoimageable encapsulant (PIE) may be used.

Other contents are substantially the same as those described in the printed circuit board 100A according to an example and the printed circuit board 100D according to another example, and a detailed description thereof will be omitted.

Figure 8:
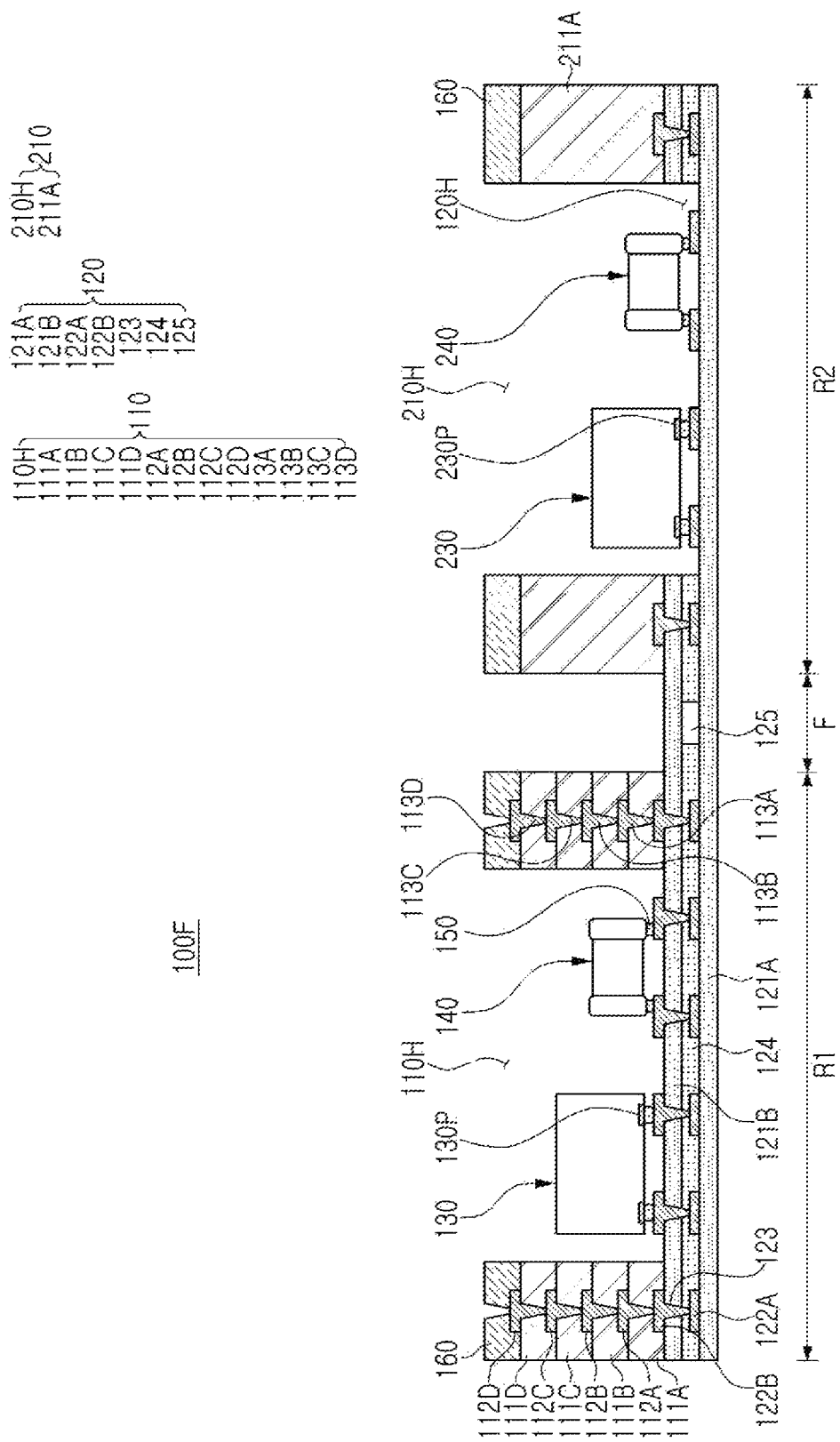
FIG. 8 is a schematic cross-sectional view of a printed circuit board according to another example.
Figure 9A:
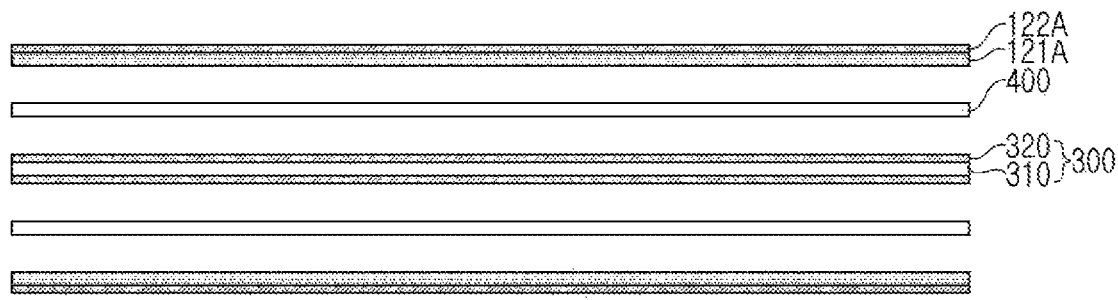
FIGS. 9A-9C, 10A-10C, 11A-11C, 12A-12C, and 13A-13C are schematic views illustrating a manufacturing process of a printed circuit board according to an example.
Figure 9B:
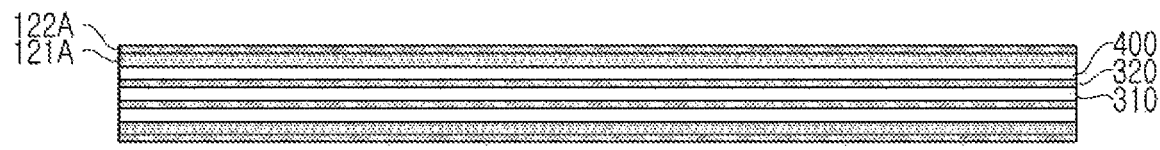
Figure 9C:
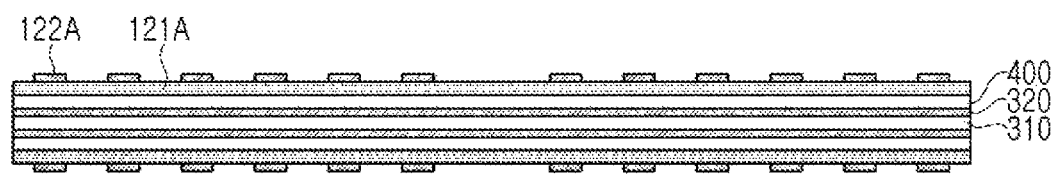
Figure 10A:
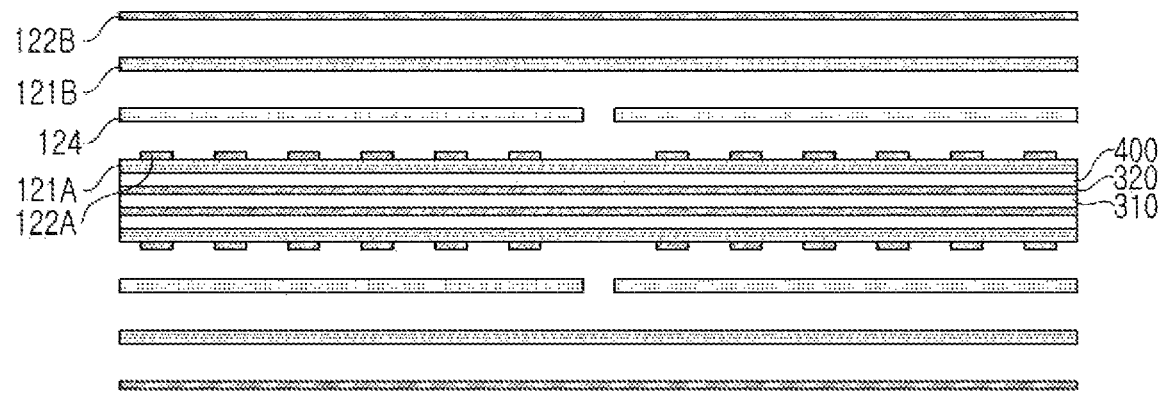
Figure 10B:
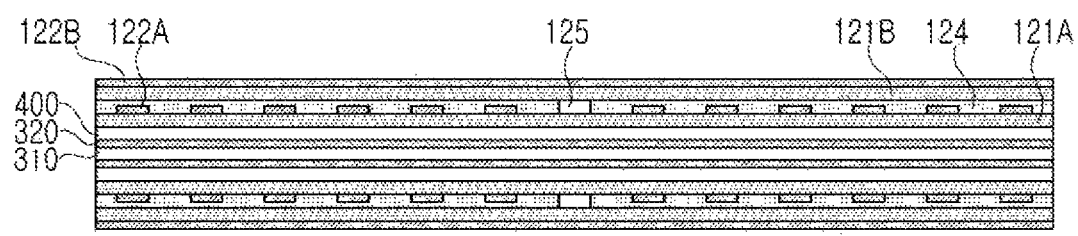
Figure 10C:
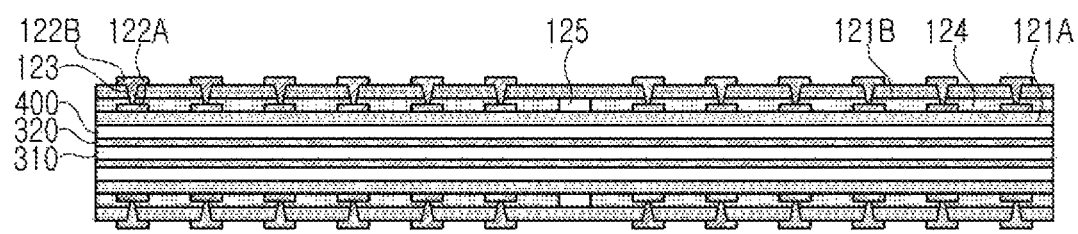
Figure 11A:
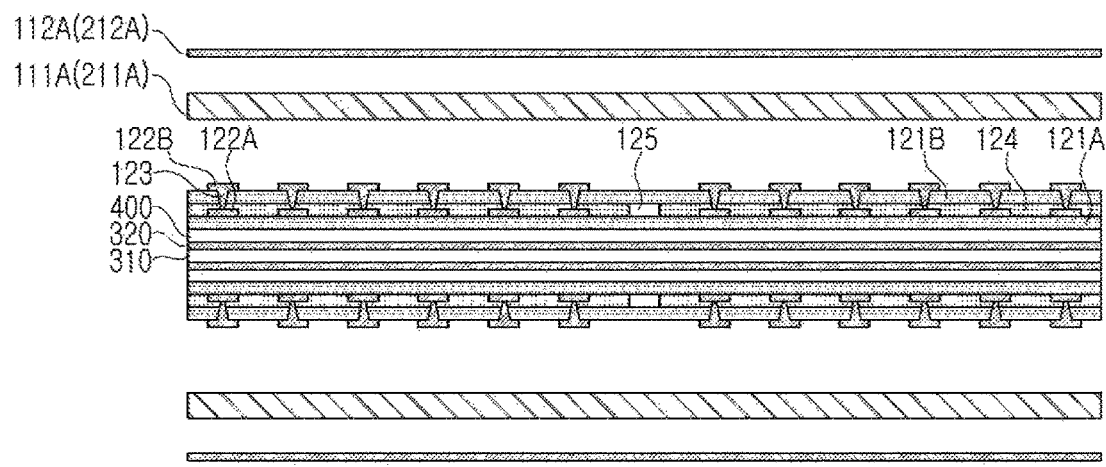
Figure 11B:
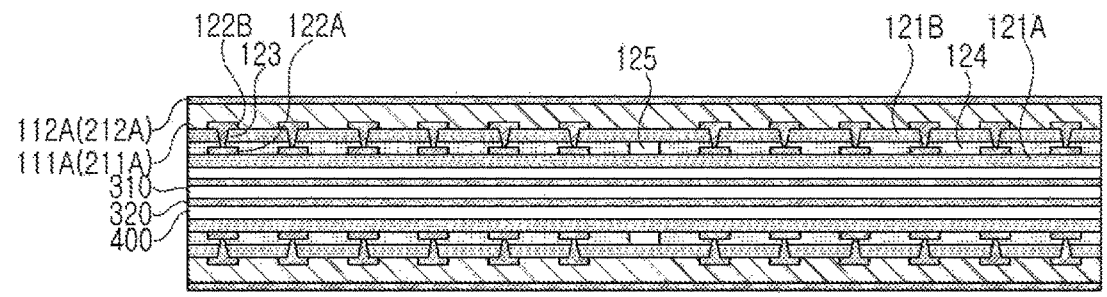
Figure 11C:
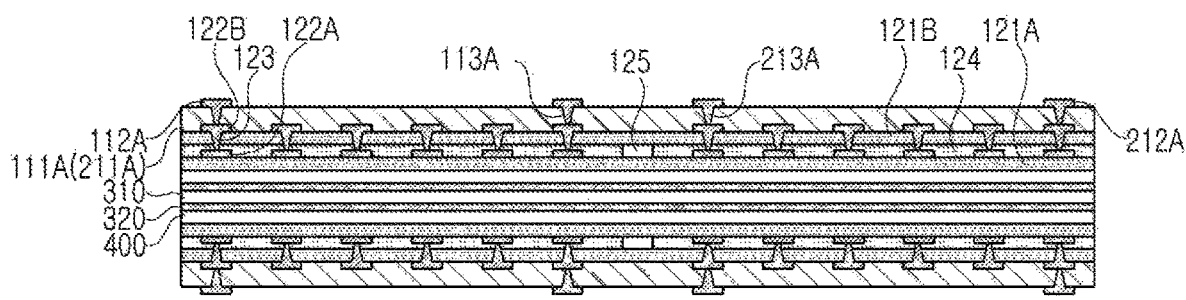
Figure 12A:
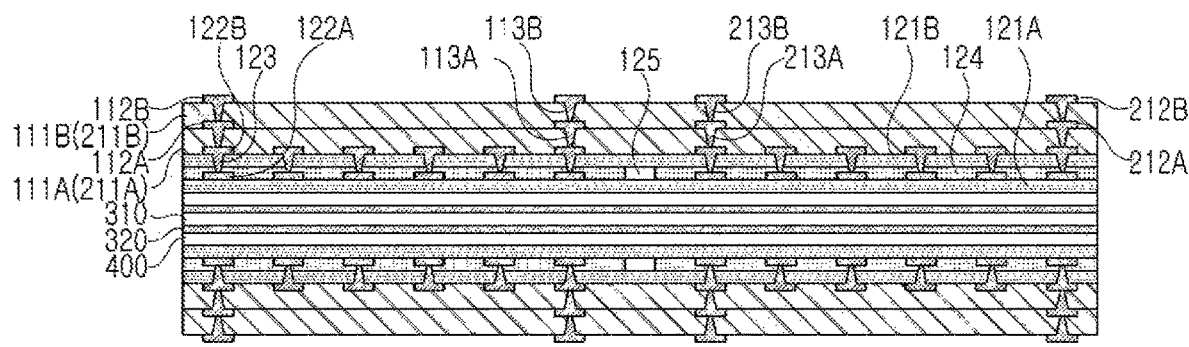
Figure 12B:
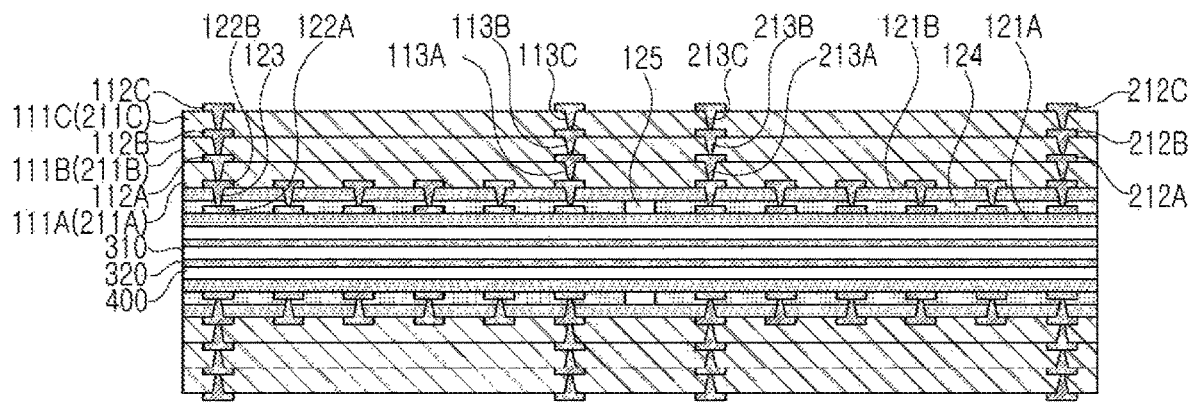
Figure 12C:
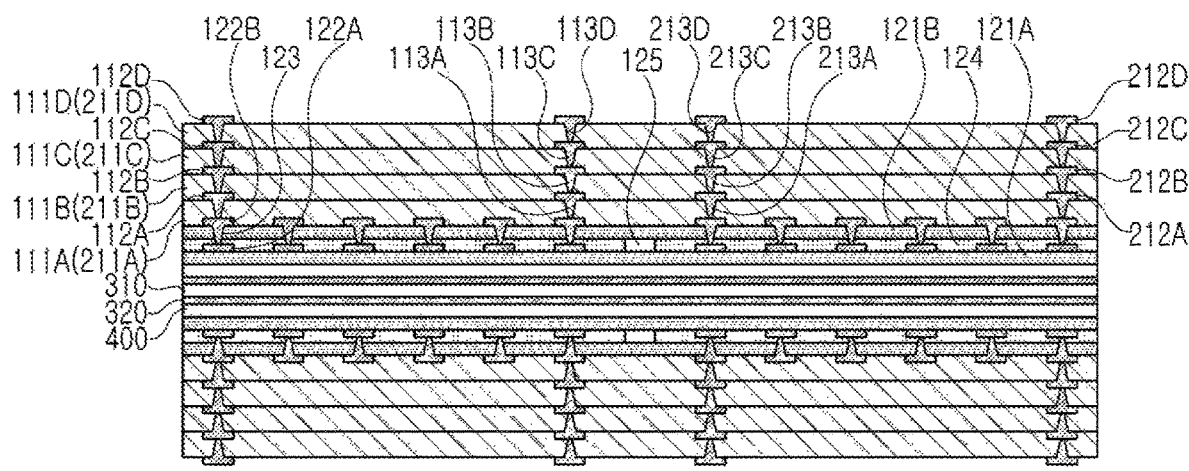

FIG. 8 is a schematic cross-sectional view of a printed circuit board 100F according to another example.

Referring to FIG. 8, as compared to the printed circuit board 110D according to the above-described example, the second build-up layer 210 does not include a wiring layer in the printed circuit board 100F according to another example. That is, when the number of wiring layers required for electrical connection of the second electronic components 230 and 240 is small, the wiring layers of the core layer 110 may be utilized, and the wiring layers may not be formed in the second build-up layer 210. However, this is merely an example for showing that the number of wiring layers included in the first build-up layer 110 and the second build-up layer 210 may be different, but the present disclosure is not limited thereto. As a non-limiting example, as shown in the drawings, when the first build-up layer 110 includes the first to fourth wiring layers 112A, 112B, 112C, and 112D, the second build-up layer 210 may include one or more to three or less wiring layers of the first to fourth wiring layers 212A, 212B, 212C, and 212D.

Other contents are substantially the same as those described in the printed circuit board 100A according to an example and the printed circuit board 100D according to another example, and a detailed description thereof will be omitted.

FIGS. 9A-9C, 10A-10C, 11A-11C, 12A-12C, and 13A-13C are views schematically illustrating a manufacturing process of a printed circuit board 100A according to an example.

Referring to FIGS. 9A-9C and 10A-10C, a metal foil laminate 300 having a metal foil 320 attached to both surfaces of an insulating layer 310, first, is prepared. The metal foil laminate 300 may be a copper clad laminate (CCL), in which the insulating layer 310 is formed of prepreg and the metal foil 320 is formed of copper foil, but is not limited thereto. Thereafter, a first insulating layer 121A and a first wiring layer 122A are laminated on both surfaces of the metal foil laminate 300 using an adhesive member 400, and the first wiring layer 122A is patterned.

Next, an adhesive layer 124, a second insulating layer 121B, and a second wiring layer 122B are stacked, and the second wiring layer 122B is patterned. In this case, a via 123 penetrating through the second insulating layer 121B, and connecting the first wiring layer 122A and the second wiring layer 122B may be formed. Meanwhile, the adhesive layer 124 is stacked without being disposed in a position corresponding to the flexible portion of the core layer 120, such that an opening 125 may be formed. Alternately, an elastomer may be disposed in the opening 125 to be laminated.

In the drawings, the first insulating layer 121A, the first wiring layer 122A, the second insulating layer 121B, and the second wiring layer 122B are illustrated as being stacked in a state in which they are attached to each other, but is not limited thereto. The first insulating layer 121A and the first wiring layer 122A, and the second insulating layer 121B and the second wiring layer 122B may be stacked in a state in which they are not attached to each other, that is, spaced apart from each other.

Referring to FIGS. 11A-11C and 12A-12C, next, first insulating layers 111A and 211A and wiring layers 112A and 212A are stacked, and the first wiring layers 112A and 212A are patterned. In this case, first vias 113A and 213A penetrating through the first insulating layers 111A and 211A, and connecting the first wiring layers 112A and 212A and the second wiring layer 122B of the core layer 120 may be formed, as necessary.

Thereafter, second insulating layers 111B and 211B, second wiring layers 112B and 212B, and second vias 113B and 213B are formed on the first insulating layers 111A and 211A and the first wiring layers 112A and 212A. A formation method thereof is the same as a formation method of the first insulating layers 111A and 211A, the fist wiring layers 112A and 212A, and the first vias 113A and 213A as described above. Next, third insulating layers 111C and 211C, third wiring layers 112C and 212C, and third vias 113C and 213C are formed on the second insulating layers 111B and 211B and the second wiring layers 112B and 212B. A formation method thereof is also the same as a formation method of the first insulating layers 111A and 211A, the fist wiring layers 112A and 212A, and the first vias 113A and 213A as described above. Next, fourth insulating layers 111D and 211D, fourth wiring layers 112D and 212D, and fourth vias 113D and 213D are formed on the third insulating layers 111C and 211C and the third wiring layers 112C and 212C. A formation method thereof is also the same as a formation method of the first insulating layers 111A and 211A, the first wiring layers 112A and 212A, and the first vias 113A and 213A.

Figure 13A:
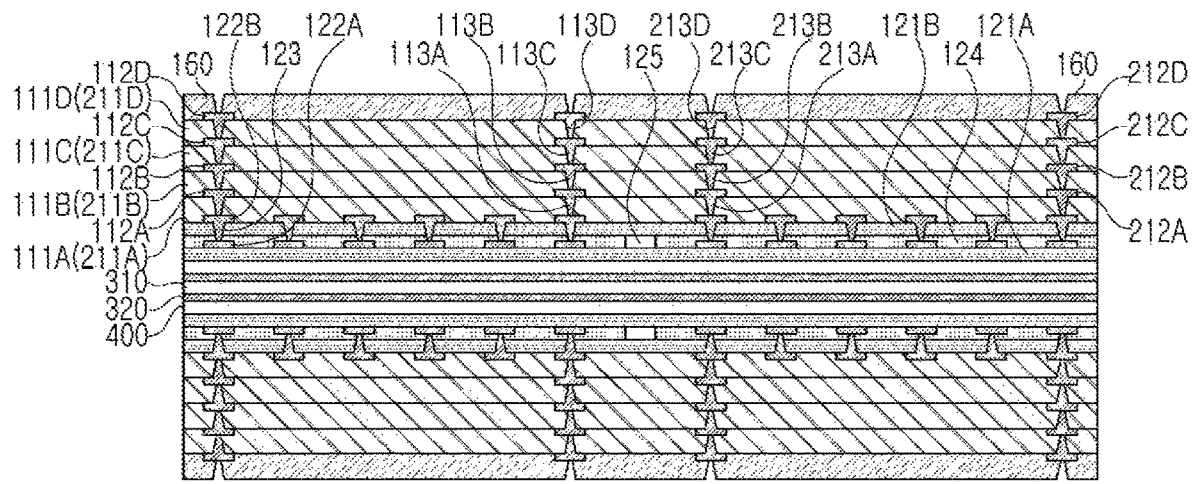
Figure 13B:
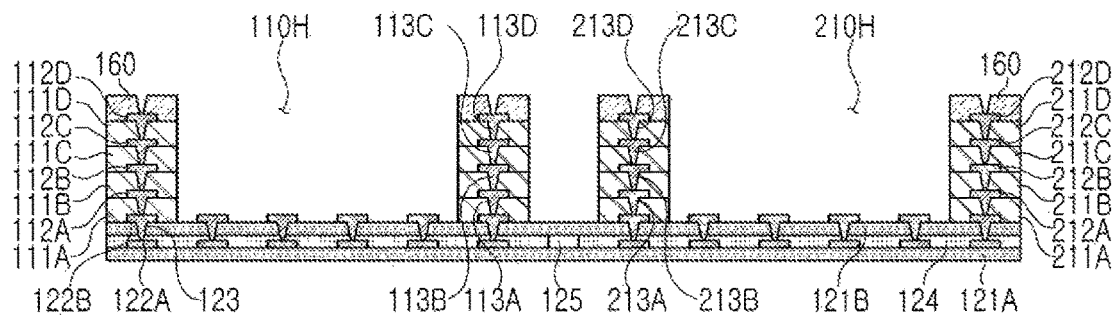
Figure 13C:
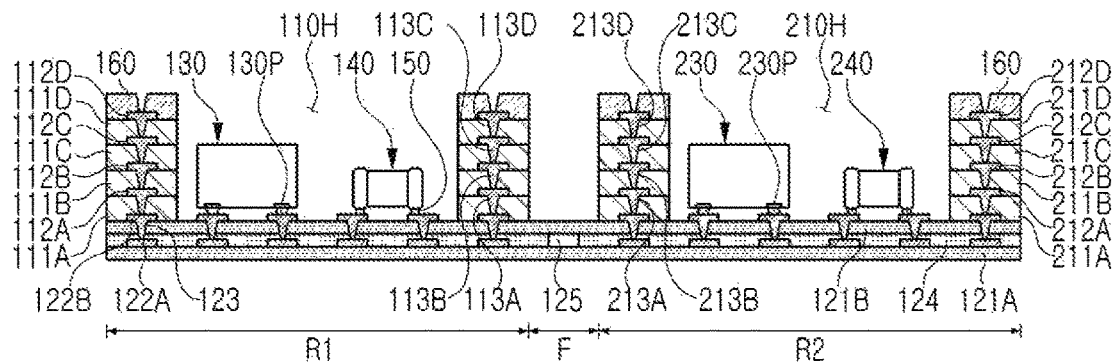

Referring to FIG. 13A-13C, a passivation layer 160 is formed on fourth insulating layers 111D and 211D and fourth wiring layers 112D and 212D. The passivation layer 160 may be formed by laminating a precursor and then curing the precursor, by applying and curing a formation material of the passivation layer 160, or the like. An opening (not labeled) may be formed in the passivation layer 160 such that at least a portion of the fourth wiring layers 112D and 212D are exposed. Thereafter, the first insulating layer 121A may be peeled away from the adhesive member 400, and a first through portion 110H and a second through portion 210H are formed in the first build-up layer 110 and the second build-up layer 210, respectively. The first through portion 110H and the second through portion 210H may be formed by a mechanical drill and/or a laser drill. In this case, it is preferable that a resin smear in the first through portion 110H and the second through portion 210H by performing a desmearing treatment such as a permanganate method, or the like. The first through portion 110H and the second through portion 210H may be performed by a sand blasting method using abrasive particles, a dry etching method using plasma, or the like. Finally, first electronic components 130 and 140 and second electronic components 230 and 240 are disposed in the first through portion 110H and the second through portion 210H, respectively, using a connection terminal 150. Therefore, the first electronic components 130 and 140 and the second electronic components 230 and 240 may be electrically connected to the second wiring layer 122B of the core layer 120 through the connection terminal 150.

Meanwhile, according to the drawings, a process of forming a printed circuit board symmetrically on both surfaces of the metal foil laminate 300 having the metal foil 320 attached to both surfaces of the insulating layers 310 has been described as an example, but is not limited thereto. A process of forming a printed circuit board by stacking insulating layers and wiring layers only on one surface of the metal foil laminate 300 to form a printed circuit board may be performed. However, when the printed circuit board is formed symmetrically on both surfaces of the metal foil laminate 300 as described above, two identical printed circuit boards may be produced, which has an advantage of excellent productivity.

In addition, a manufacturing process of the printed circuit board 100A according to an example may be changed within a range that can be implemented by those skilled in the art. For example, a manufacturing order and/or a manufacturing method of each configuration may be changed and realized.

As set forth above, as an effect of the present disclosure, it is possible to provide a printed circuit board having a thin thickness and being foldable.

As another effect of the present disclosure, it is possible to provide a printed circuit board having a short signal path and being foldable.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items. It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a first base region and a flexible region;
   a core layer including a second insulating layer including a high elastic material,_ and a second wiring layer disposed on the second insulating layer, and one via extending from the second wiring layer and disposed in the second insulating layer;
   a first build-up layer disposed on the core layer in the first base region, and including a first insulating layer including a low elastic material and having a first through portion penetrating through the first insulating layer, wherein a portion of the second wiring layer and a portion of the second insulating layer are as a bottom of the first through portion; and
   a first electronic component disposed on the second wiring layer in the first through portion and connected to the second wiring layer,
   wherein the first build-up layer further includes a first wiring layer and a first via disposed in the first insulating layer to connect the first wiring layer and the second wiring layer to each other,
   the first via and the one via have a tapered shape tapered in a direction from the first wiring layer to the second wiring layer.

2. The printed circuit board of claim 1, wherein the core layer further comprises:
   a third insulating layer disposed on an opposite side of a side of the second insulating layer on which the second wiring layer is disposed, and including a high elastic material;
   an adhesive layer disposed between the second and third insulating layers; and
   a third wiring layer disposed on the third insulating layer and embedded in the adhesive layer.

3. The printed circuit board of claim 2, wherein the adhesive layer has an opening exposing at least a portion of the second insulating layer and the third insulating layer in the flexible region.

4. The printed circuit board of claim 3, further comprising an elastomer disposed in at least a portion of the opening.

5. The printed circuit board of claim 1, further comprising a first encapsulant covering a portion of the first electronic component and a side surface of the first build-up layer, and disposed in least a portion of the first through portion.

6. The printed circuit board of claim 1, wherein the printed circuit board further has a second base region, and
   the printed circuit board further comprises a second build-up layer disposed on the core layer in the second base region, and including a fourth insulating layer including a low elastic material.

7. The printed circuit board of claim 6, wherein the second build-up layer has a second through portion penetrating through the fourth insulating layer, and
   the printed circuit board further includes a second electronic component disposed in the second through portion and connected to the second wiring layer.

8. The printed circuit board of claim 6, wherein the core layer further comprises:
   a third insulating layer disposed on an opposite side of the second insulating layer on which the second wiring layer is disposed;
   an adhesive layer disposed between the second and third insulating layers; and
   a third wiring layer disposed on the third insulating layer and embedded in the adhesive layer.

9. The printed circuit board of claim 8, wherein the second build-up layer has a second through portion penetrating through the fourth insulating layer,
   the core layer has a third through portion penetrating through the second insulating layer and the adhesive layer in the second base region, and extending from the second through portion, and
   the printed circuit board further includes a second electronic component disposed in the second through portion and the third through portion and connected to the third wiring layer.

10. The printed circuit board of claim 6, wherein the flexible region is disposed between the first base region and the second base region.

11. The printed circuit board of claim 10, wherein the flexible region is exposed from the first build-up layer and the second build-up layer.

12. The printed circuit board of claim 6, wherein at least any one of the first build-up layer or the second build-up layer comprises one or more wiring layers, and
the number of the wiring layers included in the first build-up layer and the number of wiring layers included in the second build-up layer are different from each other.

13. The printed circuit board of claim 6, wherein at least any one of the first build-up layer or the second build-up layer comprises one or more wiring layers, and
the number of the wiring layers included in the first build-up layer and the number of wiring layers included in the second build-up layer are the same.

14. The printed circuit board of claim 1, further comprising a passivation layer disposed on the first build-up layer.

15. The printed circuit board of claim 1, wherein the high elastic material has a modulus of elasticity greater than that of the low elastic material.

16. The printed circuit board of claim 1, wherein the high elastic material has a greater limitation of reversible elasticity than that of the low elastic material.

17. A printed circuit board comprising:
a first base region and a flexible region;
a core layer including a second insulating layer including a high elastic material and a second wiring layer disposed on the second insulating layer;
a first build-up layer disposed on the core layer in the first base region, and including a first insulating layer including a low elastic material and having a first through portion penetrating through the first insulating layer; and
a first electronic component disposed in the first through portion and connected to the second wiring layer,
wherein the core layer further comprises:
a third insulating layer disposed on an opposite side of a side of the second insulating layer on which the second wiring layer is disposed, and including a high elastic material;
an adhesive layer disposed between the second and third insulating layers; and
a third wiring layer disposed on the third insulating layer and embedded in the adhesive layer,
the adhesive layer has an opening exposing at least a portion of the second insulating layer and the third insulating layer in the flexible region, and
the printed circuit board o further comprises an elastomer disposed in at least a portion of the opening.

18. The printed circuit board of claim 17, further comprising a first encapsulant covering a portion of the first electronic component and a side surface of the first build-up layer, and disposed in least a portion of the first through portion.

19. The printed circuit board of claim 17, wherein the printed circuit board further has a second base region, and
the printed circuit board further comprises a second build-up layer disposed on the core layer in the second base region, and including a fourth insulating layer including a low elastic material.

20. The printed circuit board of claim 19, wherein the second build-up layer has a second through portion penetrating through the fourth insulating layer, and
the printed circuit board further includes a second electronic component disposed in the second through portion and connected to the second wiring layer.

* * * * *